United States Patent [19]

Zampini

[11] Patent Number: 5,266,440
[45] Date of Patent: Nov. 30, 1993

[54] PHOTORESIST COMPOSITION WITH AROMATIC NOVOLAK BINDER HAVING A WEIGHT-AVERAGE MOLECULAR WEIGHT IN EXCESS OF 1500 DALTONS

[75] Inventor: Anthony Zampini, Westborough, Mass.

[73] Assignee: Shipley Company Inc., Marlborough, Mass.

[21] Appl. No.: 24,799

[22] Filed: Mar. 1, 1993

Related U.S. Application Data

[63] Continuation of Ser. No. 600,904, Oct. 22, 1990, abandoned, which is a continuation-in-part of Ser. No. 411,670, Sep. 25, 1989, abandoned, which is a continuation of Ser. No. 108,192, Oct. 13, 1987, abandoned, which is a continuation-in-part of Ser. No. 2,364, Dec. 23, 1986, abandoned.

[51] Int. Cl.$^5$ .................. G03F 7/023; G03F 7/32; G03F 7/012
[52] U.S. Cl. .................. 430/192; 430/165; 430/167; 430/191; 430/192; 430/193; 430/197; 430/325; 430/326
[58] Field of Search .............. 430/165, 191, 192, 193, 430/167, 197, 325, 326; 528/143, 165, 156, 144, 158

[56] References Cited

U.S. PATENT DOCUMENTS

| | | | |
|---|---|---|---|
| 2,437,710 | 3/1948 | Hamilton | 528/212 |
| 4,529,682 | 7/1985 | Toukhy | 430/190 |
| 4,614,826 | 9/1986 | Katayama et al. | 549/559 |
| 4,690,882 | 9/1987 | Tanigaki et al. | 430/192 |
| 4,731,319 | 3/1988 | Kohara et al. | 430/165 |
| 4,797,346 | 1/1989 | Yamamoto et al. | 430/192 |
| 4,920,028 | 4/1990 | Lazarus et al. | 430/192 |
| 4,983,492 | 1/1991 | Trefonas, III et al. | 430/192 |
| 5,019,479 | 5/1991 | Oka et al. | 430/165 |

OTHER PUBLICATIONS

H. Hiraoka, "Functionally Substituted Novolak Resins: Lithographic Applications, Radiation Chemistry, and Photooxidation", *Materials for Microlithography*, American Chemical Society pp. 339-360 (1984).

H. Hiraoka et al., "Functionally Substituted Novolac Resins: Lithographic Applications Radiation Chemistry, and Photooxidation", Polym. Prepr. (Am. Chem. Soc., Dir. Polym. Chem.), vol. 25, No. 1, pp. 322-323 (1984).

*Primary Examiner*—Charles L. Bowers, Jr.
*Assistant Examiner*—John S. Chu
*Attorney, Agent, or Firm*—Robert L. Goldberg; Peter F. Corless

[57] ABSTRACT

A photoresist comprising a light sensitive component and an essentially aromatic alkali soluble novolak resin comprising the product resulting from the acid condensation of an aromatic aldehyde and a phenol where the resin has a molecular weight in excess of 1,500 and a glass transition temperature in excess of 125° C. If desired, the aromatic novolak resin may be blended with a conventional novolak resin to regulate the glass transition temperature of the resin.

24 Claims, No Drawings

PHOTORESIST COMPOSITION WITH AROMATIC NOVOLAK BINDER HAVING A WEIGHT-AVERAGE MOLECULAR WEIGHT IN EXCESS OF 1500 DALTONS

CROSS REFERENCE TO RELATED APPLICATIONS

This is a continuation of copending application(s) Ser. No. 07/600,904 filed on Oct. 22, 1990, now abandoned, which is a continuation-in-part of copending U.S. patent application Ser. No. 07/411,670 filed Sep. 25, 1989, now abandoned, which application in turn is a continuation of U.S. patent application Ser. No. 07/108,192 filed Oct. 13, 1987 (now abandoned) which latter application is a continuation-in-part of U.S. patent application Ser. No. 002,364 filed Dec. 23, 1986 (now abandoned).

BACKGROUND OF THE INVENTION

1. Introduction

This invention relates to a photoresist composition comprising a light-sensitive component admixed with a binder that is a novel novolak resin formed from one or more phenols and one or more aromatic aldehydes or a blend of said novolak resin with another resin typically used in a photoresist composition including conventional novolak and other phenolic resins.

2. Description of the Prior Art

Photoresist compositions are well known in the art and described in numerous publications including DeForest, *Photoresist Materials and Processes*, McGraw-Hill Book Company, New York, 1975. Photoresists comprise coatings produced from solution or applied as a dry film which, when exposed to light of the proper wavelength, are chemically altered in their solubility to certain solvents (developers). Two types are known. The negative-acting resist is initially a mixture which is soluble in its developer, but following exposure to activating radiation, becomes insoluble in developer thereby defining a latent image. Positive-acting resists work in the opposite fashion, light exposure making the resist soluble in developer.

Positive-working photoresists are more expensive than negative-working photoresists but are capable of providing superior image resolution. For example, the positive-working photoresist described above can be developed to yield relief images with a line width as low as one micron or less. In addition, considering the cross section of a photoresist image, the channels formed in the resist by development have square corners and sidewalls with only minimal taper.

The positive-working resists comprise a light sensitive compound in a film-forming polymer binder. The light sensitive compounds, or sensitizers as they are often called, most frequently used are esters and amides formed from o-quinone diazide sulfonic and carboxylic acids. These esters and amides are well known in the art and are described by DeForest, supra, pages 47-55, incorporated herein by reference. These light sensitive compounds, and the methods used to make the same, are all well documented in prior patents including German Pat. No. 865,140 granted Feb. 2, 1953 and U.S. Pat. Nos. 2,767,092; 3,046,110; 3,046,112; 3,046,119; 3,046,121; 3,046,122 and 3,106,465, all incorporated herein by reference. Additional sulfonic amide sensitizers that have been used in the formulation of positive-acting photoresists are shown in U.S. Pat. No. 3,637,384, also incorporated herein by reference. These materials are formed by the reaction of a suitable diazide of an aromatic sulfonyl chloride with an appropriate resin amine. Methods for the manufacture of these sensitizers and examples of the same are shown in U.S. Pat. No. 2,797,213, incorporated herein by reference. Other positive-working diazo compounds have been used for specific purposes. For example, a diazo compound used as a positive-working photoresist for deep U.V. lithography is Meldrum's diazo and its analogs as described by Clecak et al, *Technical Disclosure Bulletin*, Volume 24, Number 4, September 1981, IBM Corporation, pp. 1907 and 1908. An o-quinone diazide compound suitable for laser imaging is shown in U.S. Pat. No. 4,207,107. The aforesaid references are also incorporated herein by reference.

A class of negative resists comprising a negative-acting sensitizer in a polymer binder is described by Iwayanagi et al, *IEEE Transactions on Electron Devices*, Vol. ED-28, No. 11, November, 1981, incorporated herein by reference. The resists of this reference comprise an aromatic azide in a phenolic binder. It is believed that these resists are first disclosed and claimed in U.S. Pat. No. 3,869,292, also incorporated herein by reference. Additional aromatic azide sensitizers are disclosed by DeForest, supra, and U.S. Pat. Nos. 2,940,853 and 2,852,379, incorporated herein by reference.

The resin binders most frequently used with the o-quinone diazides in commercial practice are the alkali soluble phenol formaldehyde resins known as the novolak resins. Photoresists using such polymers are illustrated in U.K. Pat. No. 1,110,017, incorporated herein by reference. These materials are the product of reaction of a phenol with formaldehyde under conditions whereby a thermoplastic polymer is formed with a glass transition temperature of about 100° C. Novolaks with glass transition temperatures in excess of 100° C are known but are not generally used in photoresist formulations because they are expensive and involve extraction of low molecular weight fractions.

Another class of binders used with both the negative-acting aromatic azides and the positive acting o-quinone diazides are the homopolymers and copolymers of vinyl phenol. Photoresists of this nature are disclosed in U.S. Pat. No. 3,869,292, supra. It is believed that photoresists using binders of polymers formed from vinyl phenols have not found extensive use in commerce.

In the prior art, the above described positive resists using novolak resins as a binder are most often used as masks to protect substrates from chemical etching in photo-engraving processes. For example, in a conventional process for the manufacture of a printed circuit board, a copper-clad substrate is coated with a layer of a positive working photoresist, exposed to actinic radiation to form a latent circuit image in the photoresist coating, developed with a liquid developer to form a relief image and etched with a chemical etchant whereby unwanted copper is removed and copper protected by the photoresist mask is left behind in a circuit pattern. For the manufacture of printed circuit boards, the photoresist must possess chemical resistance, must adhere to the circuit board substrate, and for high density circuits, must be capable of fine line image resolution.

Similar photoresists are also used in the fabrication of semiconductors. As in the manufacture of printed circuits, the photoresist is coated onto the surface of a semiconductor wafer and then imaged and developed. Following development, the wafer is typically etched with an etchant whereby the portions of the wafer bared by the development of the photoresist are dissolved while the portions of the wafer coated with photoresist are protected, thereby defining a circuit pattern. For use in the manufacture of a semiconductor, the photoresist must possess resistance to chemical etchants, must adhere to the surface of the semiconductor wafer and must be capable of very fine line image resolution.

Recent developments in photoresist technology involve processes where high temperatures are encountered. For example, a recent development in the fabrication of semiconductors substitutes dry plasma etching for wet chemical etching to define a circuit. Plasma etching provides advantages over wet chemical etching in that it offers process simplification and improves dimensional resolution and tolerance. However, the demands on the resist are significantly greater when using plasma etching. For both wet etching and plasma etching, the resist must adhere to the substrate and must be capable of fine line image resolution. For plasma etching, in addition to these properties, the resist must often be capable of withstanding high temperatures without image deformation and without eroding as plasma etching generates high temperatures at the wafer surface.

The above described prior art positive-working resists provide good resistance to chemical etchants and fine line image resolution. However, they soften and begin to flow at temperatures somewhat in excess of about 120° C. This can result in image distortion and poorer image resolution.

SUMMARY OF THE INVENTION

The subject invention is directed to photoresist compositions useful for the same purposes as prior art photoresists, but also useful for purposes where resistance to temperatures in excess of 120° C. is required. The photoresist may be positive-acting or negative-acting photoresist, dependent upon the selection of the sensitizer. The photoresist comprises a sensitizer such as as diazo compound or an azide compound in a resin binder comprising the condensation product of a phenol and an aromatic aldehyde or a mixture of such a resin with other phenolic resins including conventional novolak resins—i.e., those prepared by the reaction of a phenol with formaldehyde in the presence of an acid catalyst.

The new resins used as binders for the photoresist exhibit glass transition temperatures in excess of 125° C. and many exhibit glass transition temperatures as high as 175° C. or higher. The novel resins are compatible with conventional novolak resins and other resins including other phenolic resins to provide new polymer mixtures exhibiting excellent film forming and thermal properties. Where the glass transition temperature of the new resins of the invention and other resins used in combination with those of the invention are known, resin blends are readily prepared exhibiting any desired intermediate glass transition temperature by adjustment of the concentration of each resin in the blend.

DESCRIPTION OF THE PREFERRED EMBODIMENTS

As described above, the invention is directed to a photoresist composition that comprises an admixture of a light sensitive component and an aromatic novolak resin binder. The aromatic novolak resins are acid catalyzed condensation products of one or more phenols and an aromatic aldehyde formed by the condensation of the reactants in the presence of a strong acid and a divalent sulfur compound as a catalyst. The phenol is of the type conventionally used in the formation of novolak resins, such as, for example, phenol itself, the cresols, xylenols, resorcinols, naphthols and bisphenols such as 4,4-isopropylidene diphenol. Preferred phenols for purposes of the invention include the cresols and 2,6-bis(hydroxymethyl)-p-cresol, m-cresol being most preferred.

The aromatic novolak is one formed by condensation of the phenol with an aromatic aldehyde. The aromatic aldehyde is preferably one conforming to the following formula:

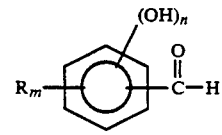

where R is a member selected from the group consisting of halogen, cyano, nitro, carboxyl, alkoxy or alkyl having from 1 to 5 carbon atoms; m is an integer ranging between 0 and 2 and n is a whole integer ranging between 0 and 3. Preferred aromatic aldehydes are those where a hydroxyl group is in a position ortho to the carbonyl group. Most preferred aromatic aldehydes are salicylaldehyde, benzaldehyde and mixtures of the two. Other aromatic aldehydes suitable for purposes of the invention include 2-chlorobenzaldehyde, 3-hydroxy benzaldehyde, 4-hydroxy benzaldehyde, 2-methoxy benzaldehyde, 3-nitro benzaldehyde, etc. Mixtures of aromatic aldehydes may also be used. In a lesser preferred embodiment, the aromatic aldehyde may be mixed with formaldehyde or a formaldehyde precursor such as paraformaldehyde if desired. However, the aromatic aldehyde preferably is in molar excess of formaldehyde, more preferably comprises at least 90% by weight and most preferably is the only aldehyde used to form the resin.

The aromatic novolak resins are formed by condensing the aromatic alcohol with the aromatic aldehyde in the presence of a strong acid and a divalent sulfur compound as a catalyst. The molar concentration of the aromatic aldehyde may be slightly less than that of the aromatic alcohol, but unexpectedly, may also be equivalent to or slightly in excess of the aromatic alcohol without formation of a cross linked resin. In this respect, the ratio of the phenol to the aldehyde may vary between about 1.1 to 1.0 and 1.0 to 1.1.

Aromatic aldehydes, compared to formaldehyde, are less reactive towards condensation reactions leading to polymerization. However, under more vigorous reaction conditions, aromatic aldehydes can condense with a reactive phenol in the presence of a strong mineral or organic acid such as sulfuric acid or toluene sulfonic acid. Generally, the polymers produced by this procedure are of low molecular weight, possess poor physical and mechanical properties and are generally unsuitable for lithographic properties. However, it has been found that by using catalytic amounts of ionizable compounds of divalent sulfur such as sulfur dichloride, sodium thiosulfate, hydrogen sulfide, sodium sulfide, thiols, thiophenols, thioacetic acid, thioglycolic acid, mercapto alkyl sulfonic acid or hydroxyalkyl thiols in conjunction with a strong acid catalyst such as sulfuric acid or toluene sulfonic acid, the condensation of the aromatic aldehyde with a reactive phenol results in the formation of polymers that are of high molecular weight, and therefore, are more suitable as resins for coating compositions, especially for photoresist coating compositions.

Whereas in the prior art, aromatic aldehydes could not be reacted with phenols to produce resins having weight average molecular weights in excess of about 1,000 Daltons, in accordance with the method disclosed herein for the formation of aromatic novolak resins, the resins can be formed having weight average molecular weights in excess of 1,500 Daltons and typically in excess of 2,500 Daltons. Further, with respect to molecular weight, it has been found that the molecular weight distribution of the resins produced in accordance with the invention generally have a narrow molecular weight distribution, especially when m-cresol is used as the phenol. In addition to increased molecular weight, the resins of the invention have improved glass transition temperatures generally in excess of 125° C. and often in excess of 175° C. Though not wishing to be bound by theory, it is believed that the improved thermal properties of the resin are due to strong hydrogen bonding and a more rigid polymer backbone.

The aromatic novolak resins are formed by mixing the reactants and a dehydrating solvent in a reactor and refluxing the mixture at an elevated temperature for a period of time sufficient to form a polymer of at least the weight average molecular weight given above. The reactor may be any conventional condensation reactor equipped with an agitator, means for reflux and distillation and conventional heat transfer means as required to perform the reaction. In general, a preferred method for carrying out the condensation reaction is to dissolve the condensation agent (the aromatic aldehyde) and the aromatic alcohol in an appropriate dehydrating water miscible solvent and then add the acid catalyst and ionizable divalent sulfur compound as described above. The resultant mixture is agitated and heated to reflux over a period of time ranging from about 2 to 24 hours, during which the aromatic alcohol and the aldehyde condense. The condensation reaction typically involves the formation of low molecular weight intermediates which initially form and then rearrange and combine with each other at a later stage to form higher molecular weight polymers.

Following reflux, excess water is removed from the condensate and the condensate is then subjected to distillation at a temperature of from 120° to 180° C. to complete the condensation reaction. The resin solution is then typically diluted with more solvent and added to excess water to precipitate the resin. The resin is then washed with water and dried at elevated temperature under vacuum. The resin will have a glass transition temperature of at least 125° C.

In accordance with the procedure described herein, if desired, the aromatic novolak resin may be blended with other phenolic resins such as conventional novolak resins, polyvinyl phenol resins, pyrogallol-acetone condensates or any other phenolic resins known to the art. The ratio of the aromatic novolak to the additional phenolic resin can vary within wide limits and is, in part, dependent upon the desired glass transition temperature and other desired properties of the resin blend. Preferably, the aromatic novolak resin is present in the blend in an amount of at least 10 percent by weight, more preferably in predominant proportion, and most preferably in an amount that varies from 80 to 100 percent by weight of the blend. Other additives may be present in the resin blend as would be obvious to those skilled in the art.

The method of forming a blend of the aromatic novolak with another phenolic resin is not critical and is not considered to be a part of the invention. The two resins, in finely divided powder form or in solution may be mixed with each other using methods known to the art.

The following examples will better illustrate the method for the formulation of the novel aromatic resins discussed herein and provides comparison of the same with prior art resins and methods for making prior art aromatic resins.

EXAMPLE 1

A m-Cresol Salicylaldehyde Resin

A mixture of 183.2 grams salicylaldehyde, 162.2 grams m-cresol, 5.0 grams 3-mercaptopropionic acid, 1.5 grams of a 50 percent aqueous solution of p-toluene sulfonic acid and 200 ml of glacial acetic acid were charged into a 1-liter reaction vessel equipped with a paddle stirrer, reflux condenser and a nitrogen inlet tube. The mixture was heated to reflux and maintained at reflux for 16 hours. The reaction mixture was slowly poured into 7 liters of deionized water to precipitate the resin. Once the solvent had exchanged with water, the product was collected on a filter, slurried once in warm deionized water for about 30 minutes, again collected, rinsed with water and dried in a vacuum oven under about 125 mm Hg and at about 100° to 105° C. About 286 grams of a brown powder was obtained.

EXAMPLE 2

A m-Cresol Salicylaldehyde Resin—Additional Example

A mixture of 184.1 grams of salicylaldehyde, 162.2 grams of m-cresol, 5.0 grams of 3-mercaptopropionic acid, 1.5 grams of p-toluenesulfonic acid and 200 ml of glacial acetic acid were charged into a 1-liter reactor vessel equipped with a paddle stirrer, reflux condenser and a nitrogen inlet tube. The mixture was heated to reflux and maintained at reflux for 7.5 hours. The reaction mixture was slowly added to a 7-liter flask of deionized water to precipitate the resin. Once the solvent had exchanged with water, the product was collected on a filter, slurried in warm deionzized water for 30 minutes, again collected, rinsed with water and dried in a vacuum oven under 125 mm Hg and at about 105° to 110° C. About 297 grams of a brown powder having a weight average molecular weight of 4,138 Daltons and a polydispersity of 2.1 was collected. Due to the nature of the primary and secondary structure of the resin, its glass transition temperature could not be determined from the differential scanning calorimetry melting curve but it can be stated that it possessed a glass transition temperature in excess of 150° C.

EXAMPLE 3

An o-Cresol Salicylaldehyde Resin

A mixture of 183.6 grams of salicylaldehyde, 162.2 grams of o-cresol, 3.0 grams of 3-mercaptopropionic acid, 1.1 grams of p-toluenesulfonic acid monohydrate and 75 ml of bis(2-methoxyethyl)ether were charged into a 1-liter reaction vessel equipped with a paddle stirrer, reflux condenser and a nitrogen inlet tube. The mixture was heated to reflux and maintained at reflux for 4.0 hours. The more volatile components in the reaction mixture were then removed by distillation at ambient pressure under a constant flow of nitrogen. The mixture temperature was then raised and maintained between 170° and 178° C. for 2 hours to complete the reaction. Upon cooling, the product mixture was diluted first with 150 ml of glacial acetic acid followed by 300 ml of methanol. The solution was slowly added to 3.2 liters of deionized water to precipitate the resin. Once the solvent had exchanged with water, the product was collected on a filter, slurried in warm deionized water, rinsed with water and dried in vacuum oven under about 125 mm Hg and at about 115° to 120° C. About 289 grams of a brown powder having a weight average molecular weight of 19,439 Daltons and a polydispersity of 7.32 was obtained. Due to the nature of the primary and secondary structure of the resin, its glass transition temperature could not be determined from the differential scanning calorimetry melting curve but it can be stated that its glass transition temperature exceeded 150° C.

EXAMPLE 4

A p-Cresol Salicylaldehyde Resin

A mixture of 183.2 grams of salicylaldehyde, 162.2 grams of p-cresol, 3.0 grams of 3-mercaptopropionic acid, 1.1 grams of p-toluenesulfonic acid monohydrate and 75 ml of bis(2-methoxyethyl)ether were charged into a 1-liter reactor vessel equipped with a paddle stirrer, reflux condenser and a nitrogen inlet tube. The reaction was carried out according to the procedure of Example 3 to yield about 272.5 grams of resin having a weight average molecular weight of 11,622 Daltons and a polydisperisity of 7.39. Due to the nature of the primary and secondary structure of the resin, its glass transition temperature could not be determined from the differential scanning calorimetry melting curve but it can be stated that its glass transition temperature exceeded 150° C.

EXAMPLE 5

A m-Cresol Salicylaldehyde-Benzaldehyde Resin

A mixture of 778.6 grams of salicylaldehyde, 453.1 grams of benzaldehyde, 357.8 grams of m-cresol, 14.5 grams of 3-mercaptopropionic acid, 9.6 grams of p-toluenesulfonic acid monohydrate and 650 ml of propionic acid were charged into a 4-liter reaction vessel equipped with a paddle stirrer, reflux condenser and a nitrogen inlet tube. The mixture was heated to reflux and maintained at reflux for 4.0 hours. The more volatile components in the reaction mixture were then removed by distillation at ambient pressure under a constant flow of nitrogen. The mixture temperature was then raised and maintained between 141° and 145° C. and allowed to reflux for 4 hours to complete the reaction. Upon dilution with 1.6 liters of propionic acid, the resin solution was precipitated into 14 liters of deionized water. The product was collected on a filter, slurried in 14 liters of deionized water, collected by filtration, rinsed with deionized water and dried at 110° to 115° C. About 1,485 grams of a brown powder having a weight average molecular weight of 1,790 Daltons and a polydispersity of 1.95 was obtained having a glass transition temperature of about 177° C.

EXAMPLE 6

An m-Cresol Salicylaldehyde 2,6-bis(hydroxymethyl)-p-Cresol Resin

A mixture of 146.0 grams m-cresol, 146.5 grams salicylaldehyde, 25.2 grams 2,6-bis(hydroxymethyl)-p-cresol, 5.0 grams 3 mercaptoproprionic acid and 1.5 grams p-toluenesulfonic acid monohydrate in 200 ml glacial acetic acid was reacted as described in Example 1 and about 281 grams of resin was obtained. The resin had a glass transition temperature of 233° C. and a molecular weight of about 4,085 Daltons with a weight average molecular weight to a number average molecular weight of 2.77.

EXAMPLE 7-21

Misc. Cresol Aromatic Aldehyde Resins

Following generally the procedures of Examples 1 to 5, additional polymers were prepared using various combinations of monomers. The monomers, their mole ratio and the glass transition temperature and weight average molecular weight of the polymers formed are set forth in the following table:

| Example No. | Monomers | Mole % | Tg. °C. | Molecular Weight Average |
|---|---|---|---|---|
| 7 | m-Cresol | 50 | 152 | 2,023 |
|  | Benzaldehyde | 50 |  |  |
| 8 | m-Cresol | 50 | None obs. | 4,138 |
|  | Salicylaldehyde | 50 |  |  |
| 9 | m-Cresol | 50 | 164 | 3,038 |
|  | Benzaldehyde | 45 |  |  |
|  | Salicylaldehyde | 5 |  |  |
| 10 | m-Cresol | 50 | 166 | 2,610 |
|  | Banzaldehyde | 40 |  |  |
|  | Salicylaldehyde | 10 |  |  |
| 11 | m-Cresol | 50 | 147 | 1,962 |
|  | Benzaldehyde | 38 |  |  |
|  | Salicylaldehyde | 12 |  |  |
| 12 | m-Cresol | 50 | nm | 2,001 |
|  | Banzaldehyde | 36.6 |  |  |
|  | Salicylaldehyde | 13.3 |  |  |
| 13 | m-Cresol | 50 | nm | 2,317 |
|  | Benzaldehyde | 36 |  |  |
|  | Salicylaldehyde | 14 |  |  |
| 14 | m-Cresol | 50 | 147 | 1,999 |
|  | Benzaldehyde | 35 |  |  |
|  | Salicylaldehyde | 15 |  |  |
| 15 | m-Cresol | 50 | 161 | 2.319 |
|  | Benzaldehyde | 25 |  |  |
|  | Salicylaldehyde | 25 |  |  |
| 16 | m-Cresol | 50 | 189 | 2,826 |
|  | Benzaldehyde | 17 |  |  |
|  | Salicylaldehyde | 33 |  |  |
| 17 | o-Cresol | 50 | 125 | 4,328 |
|  | Banzaldehyde | 30 |  |  |
|  | Salicylaldehyde | 20 |  |  |
| 18 | o-Cresol | 50 | 132 | 4,446 |
|  | Benzaldehyde | 25 |  |  |
|  | Salicylaldehyde | 25 |  |  |
| 19 | o-Cresol | 50 | 134 | 6,610 |
|  | Benzaldehyde | 20 |  |  |
|  | Salicylaldehyde | 30 |  |  |
| 20 | m-Cresol | 43.3 | 133 | 1,667 |
|  | p-Cresol | 13.3 |  |  |
|  | Benzaldehyde | 26 |  |  |
|  | Salicylaldehyde | 24 |  |  |
| 21 | m-Cresol | 43.3 | 131 | 3,041 |
|  | o-Cresol | 13.3 |  |  |
|  | Benzaldehyde | 26 |  |  |
| 22 | m-Cresol | 33 | 138 | 2,007 |
|  | o-Cresol | 17 |  |  |
|  | Benzaldehyde | 30 |  |  |
|  | Salicylaldehyde | 20 |  |  |
| 23 | m-Cresol | 25 | 125 | 2,343 |
|  | o-Cresol | 25 |  |  |

-continued

| Example No. | Monomers | Mole % | Tg. °C. | Molecular Weight Average |
|---|---|---|---|---|
| | Benzaldehyde | 30 | | |
| | Salicylalehyde | 20 | | |
| 24 | m-Cresol | 17 | 131 | 2,564 |
| | o-Cresol | 33 | | |
| | Benzaldehyde | 30 | | |
| | Salicylaldehyde | 20 | | |
| 25 | o-Cresol | 50 | 132 | 4,446 |
| | Saliclaldehyde | 25 | | |
| | Benzaldehyde | 25 | | |
| 26 | m-Cresol | 33 | 138 | 2,007 |
| | o-Cresol | 17 | | |
| | Benzaldehdye | 30 | | |
| | Salicylaldehyde | 20 | | |
| 27 | m-Cresol | 43.3 | 133 | 1,667 |
| | p-Cresol | 13.3 | | |
| | Benzaldehyde | 26 | | |
| | Salicylaldehyde | 24 | | |
| 28 | m-Cresol | 50 | 147 | 1,671 |
| | 3-Hydroxybenz-aldehyde | 50 | | |
| 29 | m-Cresol | 50 | nm | 1,451 |
| | 4-Hydroxybenz-aldehyde | 50 | | |

EXAMPLES 30 TO 32

Aromatic Novolak—Conventional Novolak Blends

This example exemplifies resin blends using the resin of Example 7 (Resin A) with a conventional cresol formaldehyde novolak resin (Resin B) having a glass transition temperature of 94° C.

The resin blends were prepared by adding the appropriate amount of each resin to a common flask, dissolving the two resins in methanol and then evaporating the solvent under reduced pressure. The resin blend was then raised to a temperature of between 70° and 80° C. under vacuum to remove remaining solvent. The molar ratio of Resin A to Resin B and the resultant glass transition temperature are set forth in the following table.

| Resin A to Resin B | Tg. °C. |
|---|---|
| 3 to 1 | 140 |
| 1 to 1 | 114 |
| 1 to 3 | 101 |

The following examples are comparative examples to better illustrate differences between the aromatic novolak resins used as binders herein and prior art novolak resins and prior art methods for making aromatic novolak resins.

EXAMPLE 33

A Mixed Cresol Formaldehyde Novolak [Comparative]

A 2-L four-neck resin kettle equipped with a stirrer, heating source, thermometer, variable reflux ratio distilling head and a nitrogen inlet tube was charged with 278.3 g meta-cresol, 335.5 g para-cresol, 34.3 g ortho-cresol, 68.3 g of 36.9 percent formaldehyde, 20 mL of deionized water and 12.0 g of oxalic acid dihydrate. The mixture was heated to about 60° C. at which point an exothermic condensation reaction ensued. When the reaction mixture temperature reached about 100° C., 273.3 g of 36.9 percent formaldehyde was added in about 30 minutes. The reaction was then allowed to continue for about 4 hours at reflux temperature. The more volatile components in the reaction mixture were removed by distillation at ambient pressure under a constant flow of nitrogen. When the temperature of the reaction mixture reached about 220° C., a partial vacuum pressure was applied and was gradually increased until a maximum vacuum of 7 mm Hg was achieved and the mixture was at about 228° C. The liquified resin remaining in the kettle was poured into a tray under nitrogen and allowed to cool and solidify. About 516 g of novolak resin having a glass transition temperature of about 100° C. was obtained.

EXAMPLE 34

A m-Cresol Benzaldehyde Resin Formed Without A Divalent Sulfur Compound

A mixture of 159.2 grams of benzaldehyde, 162.2 grams of m-cresol and 1.7 grams of 50% p-toluenesulfonic acid monohydrate solution were charged into a 0.5 liter reaction vessel equipped with paddle stirrer, reflux condenser and a nitrogen inlet tube. The mixture was heated to and kept at reflux for about 4 hours. The more volatile components in the reaction mixture were then removed by distillation at ambient pressure under a constant flow of nitrogen. When the reaction mixture temperature reached 220° C., the system was slowly placed under full vacuum to complete the distillation. The resin melt was then decanted from the reactor and cooled to yield about 245 grams of a brown solid having a glass transition temperature of 124° C. and a weight average molecular weight of 1,296 Daltons with a polydispersity of 1.45. Repetition of the procedure adding 2 grams of 3-mercaptopropionic acid produces 276 grams of resin with a molecular weight of 2,023 and a glass transition temperature of 152° C.

To formulate a photoresist using an aromatic novolak resin, the light sensitive compound is admixed with the resin using art recognized procedures. The light sensitive compound used may be any of the various light sensitive compounds known to be suitable as sensitizer in photoresist comprising an alkali soluble polymer binder. Examples of such compounds are described above. The amount of sensitizer used and the manner of preparing the photoresist is in accordance with art recognized procedures. In this respect, dependent upon the specific sensitizer and polymer combination, the sensitizer can vary from 0.1 to 50 weight percent of the photoresist composition and preferably varies between about 5 and 25 percent by weight of the formulation.

For use as a liquid coating composition, the photoresist components are admixed with a solvent together with other additives typically used in the prior art. Other phenolic resins are particularly suitable as additives such as for example, conventional novolak resins and polyhydroxy-carbonyl condensates such as pyrogallol-acetone, polyvinyl phenols, vinyl phenol copolymers, etc. The solvent used to form the coating composition is any solvent typically used for this purpose including glycol ethers and acetates such as the propylene glycol methyl ether acetates and monooxymonocarboylic acid esters such as ethyl lactate. A solution having a solids content of from 5 to 40 percent by weight is suitable.

The method of using photoresists of the invention is also in accordance with prior art procedures. The most conventional method comprises forming a film from solution by whirl coating, dipping, spraying, etc. Alternatively, the photoresist can be applied as a dry film in accordance with art recognized procedures.

In addition to the light sensitive constituent, other constituents such as dyes, softeners and other resins may be used in a mixture with the novolak binder as is known in the art. A particularly useful class of additives is the polyvinyl ethers such as those disclosed in U.S. Pat. No. 3,634,082, incorporated herein by reference. These polymers may be added in amounts varying from 1 to 10 percent by weight of the resist. The preferred polyvinyl ether is polyvinyl methyl ether.

The photoresist compositions of this invention are applied to conventional substrates in conventional manner. For example, the photoresist may be applied to a copper clad substrate, a semiconductor, a silicon wafer, etc. by any of whirl coating, spraying, dipping or the like. Thereafter, the substrate is dried, imaged and developed by washing with an aqueous alkaline developer.

The following examples illustrate the preparation and use of photoresists in accordance with the invention.

EXAMPLE 35

Resist Using Example 1 Novolak

The following resist formulation was prepared:

| Composition: | |
|---|---|
| Resin of Example 1 | 21.83 grams |
| PAC[1] | 4.16 grams |
| Ethyl Lactate | 52.88 grams |
| Anisole | 9.78 grams |
| Amyl Acetate | 9.78 grams |
| Performance: | |
| Photosensitivity. $mJ/cm^2$ | 21.0 |
| Contrast | 1.57 |
| Initial Film Thickness | 1.227 um |

[1] Oxo-diazonaphthalene-sulfonate mixed ester of 2,3,4-trihydroxybenzophenone.

EXAMPLE 36

Photoresist Using Example 10 Resin

A light sensitive composition solution was prepared by dissolving 20.8 g of resin of Example 10, 5.2 g of a naphthoquinone-2-diazide-5-sulfonyl ester mixture of 2,3,4-trihydroxybenzophenone, in a mixture of 65.6 g of propylene monomethyl ether acetate and 6.6 g of butyl acetate. The ultraviolet exposure energy necessary for resolving 2 microns equal lines/spaces pattern was 98 $mJ/cm^2$. The hardbake deformation temperature was found to be 155° C.

EXAMPLE 37

Photoresist Using A Blend of Two Aromatic Aldehyde Resins

A light sensitive composition solution was prepared by dissolving 17.6 g of resin of Example 10, 3.1 g of resin of Example 16, 4.94 g of a naphthoquinone-2-diazide-5-sulfonyl ester mixture of 2,3,4-trihydroxybenzophenone in 73.4 g of a solvent mixture comprising of 60 percent of ethyl lactate, 30 percent of anisole and 10 percent of amyl acetate. The ultraviolet exposure energy necessary for resolving 2 microns equal lines/spaces pattern was 105 $mJ/cm^2$. The hardbake deformation temperature was found to be 170° C.

EXAMPLE 38

Photoresist Using A Blend of An Aromatic Aldehyde Resin With a Cresylic Formaldehyde Resin A solution of a photoresist composition was prepared from 17.56 g of the resin made by the procedure of Example 33, 3.10 g of a resin prepared by the procedure of Example 10, 4.94 g of a naphthoquinone-2-diazide-5-sulfonyl ester mixture of 2,3,4-trihydroxybenzophenone and 73.4 g of a solvent mixture comprising of 60 percent of ethyl lactate, 30 percent of anisole and 10 percent of amyl acetate. The ultraviolet exposure energy necessary for resolving 2 microns equal lines-spaces pattern was 65 $mJ/cm^2$. The hardbake deformation temperature was found to be 125° C.

EXAMPLE 39

Photoresist Using A Blend of An Aromatic Aldehyde Novolak and A Pyrogallol-Acetone Condensate Resin A light sensitive composition solution was prepared by dissolving 17.56 g of resin of Example 10, 3.1 g of a pyrogallol-acetone condensate resin having a mp of 150°-160° C. and a molecular weight of 1250, 4.94 g of a naphthoquinone-2-diazide-5-sulfonyl ester mixture of 2,3,4-tri-hydroxybenzophenone in 73.2 g of a solvent mixture comprising of 60 percent of ethyl lactate, 30 percent of anisole and 10 percent of amyl acetate. The ultraviolet exposure energy necessary for resolving 2 microns equal lines/spaces pattern was 82 $mJ/cm^2$. The hot-plate hardbake deformation temperature was found to be 165°-175° C. while the convection oven hardbake was 180° C.

EXAMPLE 40

Photoresist Using A Resin Blend of An Aromatic Aldehyde Cresol Novolak and A Pyrogallol-bis-1,4-isopropenylbenzene Condensate A light-sensitive composition solution was prepared by dissolving 17.56 g of resin of Example 10, 3.1 g of a pyrogallol-bis-1,4-isopropyl benzene condensate having a molecular wight of 1354, 4.94 g of a naphthoquinone-2-diazide-5-sulfonyl ester mixture of 2,3,4-trihydroxybenzophenone in 73.2 g of a solvent mixture comprising of 60 percent of ethyl lactate, 30 percent of anisole and 10 percent of amyl acetate. The ultraviolet exposure energy necessary for resolving 2 microns equal lines/spaces pattern was 103 $mJ/cm^2$. The hot-plate hardbake deformation temperature was found to be 170° C.

EXAMPLE 41

Aromatic Aldehyde Resin Blend With Polyvinylphenol

A light sensitive composition solution was prepared by dissolving 8.78 g of resin of Example 11, 1.55 g of a polyvinylphenol polymer having a molecular weight of 1,500-7,000, 2.47 g of a naphthoquinone-2-diazide-5-sulfonyl ester mixture of 2,3,4-trihydroxybenzophenone in 36.6 g of a solvent mixture comprising of 60 percent of ethyl lactate, 30 percent of anisole and 10 percent of amyl acetate. The ultraviolet exposure energy necessary for resolving 2 microns equal lines/spaces pattern was 75 $mJ/cm^2$. The hot-plate hardbake deformation temperature was found to be 160°-180° C.

EXAMPLE 42

Aromatic Aldehyde Novolak-Cresylic Formaldehyde Novolak Blend Using A PAC Other Than A 2,3,4-Trihydroxybenzophenone Based PAC A light sensitive composition solution was prepared by dissolving 3.88 g of resin of Example 14, 1.67 g of the formaldehyde novolak condensate prepared in Example 38, 0.757 g of a naphthoquinone-2-diazide-4-sulfonyl ester mixture of 2,6-bis(4-hydroxy-3,5-dimethylbenzyl)-4-methylphenol in 11.22 g ethyl lactate, 5.61 g anisole and 1.87 g amyl acetate. The ultraviolet exposure energy necessary for resolving 1.25 microns equal lines/spaces pattern was 425 mJ/cm$^2$.

EXAMPLE 43

Photoresist Using A Resin Blend Where the Aromatic Aldehyde Novolak Contains o-Cresol A light sensitive composition solution was prepared by dissolving 18.59 g of resin of Example 17, 2.07 g of a pyrogallol-acetone condensate having a molecular weight of 1,670 and a melting point of 170°–180° C., 4.94 g of a naphthoquinone-2-diazide-5-sulfonyl ester mixture of 2,3,4-trihydroxybenzophenone in 73.8 g of a solvent mixture comprising of 60 percent of ethyl lactate, 30 percent of anisole and 10 percent of amyl acetate. The ultraviolet exposure energy necessary for resolving 2 microns equal lines/spaces pattern was 40.1 mJ/cm$^2$.

EXAMPLE 44

Photoresist Using Aromatic Aldehyde Resin Containing m- and o-Cresol Monomers

A light sensitive composition solution was prepared by dissolving 10.33 g of resin of Example 24, 2.47 g of a naphthoquinone-2-diazide-5-sulfonyl ester mixture of 2,3,4-trihydroxybenzophenone in 36.7 g of a solvent mixture comprising of 60 percent of ethyl lactate, 30 percent of anisole and 10 percent of amyl acetate. The ultraviolet exposure energy necessary for resolving 2 microns equal lines/spaces pattern was 35 mJ/cm$^2$.

EXAMPLE 45

Photoresist Using Aromatic Aldehyde Resin and Novolak Resin Blends

Radiation sensitive resist compositions containing resin blends and blends of naphthoquinone diazide compounds can demonstrate useful lithographic performance. Such blends can improve solubility, dissolution rates, coating properties, contrast, etch resistance, photospeed, resolution or feature profiles.

A light sensitive composition solution was prepared by dissolving 83.6 g of resin of Example 5, 250.8 g of the formaldehyde condensate resin of Example 33, 22.8 g of a naphthoquinone-2-diazide-5-sulfonyl ester mixture of 2,6-bis(4-hydroxy-3,5-dimethylbenzyl)-4-methylphenol, 22.8 g of a naphthoquinone-2-diazide-5-sulfonyl ester mixture of 4-benzyl-2,3,4-trihydroxybenzene in 612.4 g of a solvent mixture comprising of 90 percent ethyl lactate, 5 percent butylacetate and 5 percent xylene. The ultraviolet exposure energy necessary for resolving 1.5 microns equal lines/spaces pattern was 180 mJ/cm$^2$.

EXAMPLE 46

Photoresist Using Aromatic Aldehyde Resin

A light sensitive composition solution was prepared by dissolving 10.39 g of resin of Example 6, 2.47 g of a naphthoquinone-2-diazide-5-sulfonyl ester mixture of 2,3,4-trihydroxybenzophenone in 36.59 g of a solvent mixture comprising of 60 percent of ethyl lactate, 30 percent of anisole and 10 percent of amyl acetate. The ultraviolet exposure energy necessary for resolving 2 microns equal lines/spaces pattern was 125 mJ/cm$^2$.

The hardbake deformation temperature was found to be 180° C.

I claim:

1. A photoresist comprising an admixture of a binder and a photosensitive component, said binder being an alkali soluble aromatic novolak resin having a weight average molecular weight in excess of about 1,500 Daltons and being the product of condensation of an aromatic aldehyde and a phenol and said sensitizer comprising a binder compatible and developable material selected from the group consisting of positive-working o-quinone diazide compounds and negative-working azide compounds, said photosensitive component being present in an amount sufficient to solubilize or insolubilize the imaged areas, respectively, upon exposure to activating energy.

2. The photoresist of claim 1 where the photosensitive component is an o-quinone diazide sulfonic acid ester or amide.

3. The photoresist of claim 1 where the aromatic novolak resin comprises the product resulting from the acid condensation of an aromatic aldehyde and a phenol, said novolak resin having a weight average molecular weight in excess of 1,500 Daltons and a glass transition temperature in excess of 125° C.

4. The photoresist composition of claim 3 where the phenol is selected from the group consisting of phenol itself, a cresol, a xylenol, a naphthol, a bisphenol and mixtures thereof.

5. The photoresist of claim 3 where the aromatic aldehyde consists of at least 50 mole percent of the total aldehyde taking place in the condensation reaction.

6. The photoresist of claim 3 where the aromatic aldehyde consists of at least 90 mole percent of the total aldehyde.

7. The photoresist of claim 3 where the aromatic aldehyde component is the only aldehyde component used to make the aromatic novolak resin.

8. The photoresist of claim 3 where the aromatic aldehyde corresponds to the following formula:

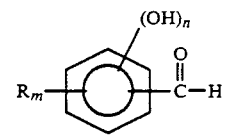

where R is a member selected from the group consisting of halogen, cyano, nitro, carboxyl, alkoxy or alkyl having from 1 to 5 carbon atoms; m is an integer ranging between 0 and 2 and n is a whole integer ranging between 0 and 3.

9. A photoresist comprising an admixture of a binder and photosensitive component, said photosensitive component comprising a binder compatible and developable material selected from the group consisting of positive-working o-quinone diazide compounds and negative-working azide compounds present in an amount sufficient to solubilize or insolubilize the imaged areas, respectively, upon exposure to activating energy and a binder comprising an aromatic novolak resin that is the product resulting from the acid condensation of a phenol and an aromatic aldehyde conforming to the formula:

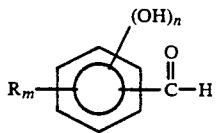

where R is a member selected from the group consisting of halogen, cyano, nitro, carboxyl, alkoxy or alkyl having from 1 to 5 carbon atoms; m is an integer ranging between 0 and 2 and n is a whole integer ranging between 0 and 3 and a phenol, said novolak resin having a weight average molecular weight in excess of 1,500 Daltons.

10. The photoresist of claim 9 where the phenol is a cresol.

11. The photoresist of claim 9 where the phenol is a cresol and the aldehyde is a member selected from the group consisting of benzaldehyde, salicylaldehyde and mixtures thereof.

12. The photoresist of claim 9 where the binder is the aromatic novolak resin in an amount of at least 10 mole percent blended with a second resin.

13. The photoresist of claim 12 where the second resin is a phenolic resin.

14. The photoresist of claim 13 where the second resin is a novolak resin that is the product resulting from the acid condensation of formaldehyde or a formaldehyde precursor and a phenol.

15. The photoresist of claim 9 where the aromatic novolak resin is the predominant phenolic resin in the blend.

16. The photoresist of claim 15 where the aromatic novolak resin comprises 51 to 100 percent by weight of the blend.

17. The photoresist of claim 15 where the aromatic novolak resin comprises in excess of 90 percent by weight of the blend.

18. The photoresist of claim 15 where the blend contains a polyhydroxy carbonyl condensate.

19. The photoresist of claim 18 where the condensate is a pyrogallol-acetone condensate.

20. A photoresist comprising an admixture of a binder and a photosensitive component, said binder being an alkali soluble aromatic novolak, the photosensitive component being a binder compatible and developable material selected from the group consisting of positive-working o-quinone diazide compounds and negative-working azide compounds and being present in an amount sufficient to solubilize or insolubilize the imaged areas, respectively, upon exposure to activating energy, said aromatic novolak binder having a weight average molecular weight in excess of about 1,500 Daltons, said aromatic novolak binder produced from a process comprising condensing an aromatic aldehyde and a phenol in the presence of acid and a catalytic effective amount of a divalent sulfur compound.

21. The photoresist of claim 20 where the novolak resin is essentially free of non-aromatic aldehyde condensation groups.

22. The photoresist of claim 20 where the novolak resin resin has a glass transition temperature in excess of about 125° C.

23. The photoresist of claim 9 where the novolak resin resin has a glass transition temperature in excess of about 125° C.

24. The photoresist of claim 20 where the novolak binder has a weight average molecular weight in excess of 2,500 Daltons.

* * * * *